US010644715B1

(12) United States Patent
Thibideau et al.

(10) Patent No.: US 10,644,715 B1
(45) Date of Patent: May 5, 2020

(54) ANALOG TO DIGITAL CONVERTER MODULE AND METHOD THEREOF

(71) Applicant: BAE SYSTEMS INFORMATION AND ELECTRONIC SYSTEMS INTEGRATION INC., Nashua, NH (US)

(72) Inventors: Bryan A. Thibideau, Goffstown, NH (US); David A. Brigham, Bedford, NH (US); Gregory S. Laste, Hudson, NH (US); Timothy Naylor, Hollis, NH (US); Jonathan E. Oppelaar, Amherst, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/209,338

(22) Filed: Dec. 4, 2018

(51) Int. Cl.
*H03M 1/12* (2006.01)
*H04B 3/50* (2006.01)

(52) U.S. Cl.
CPC .............. *H03M 1/126* (2013.01); *H04B 3/50* (2013.01)

(58) Field of Classification Search
CPC .................................. H03M 1/126; H04B 3/50
See application file for complete search history.

(56) References Cited

U.S. PATENT DOCUMENTS

| 9,231,609 | B1 * | 1/2016 | Petrovic | H03B 5/1876 |
| 2007/0183547 | A1 * | 8/2007 | Fifield | H04B 1/123 |
| | | | | 375/349 |
| 2008/0139110 | A1 * | 6/2008 | Lai | H04H 40/90 |
| | | | | 455/3.02 |

* cited by examiner

*Primary Examiner* — Janice N Tieu
(74) *Attorney, Agent, or Firm* — Sand, Sebolt & Wernow LPA

(57) ABSTRACT

An analog-to-digital converter (ADC) module includes a plurality of frequency stacked ADCs. A splitter splits channels into two segments to transmit the signal through respective low pass and high pass filters to send the analog signal to a low frequency ADC and a high frequency ADC along each channel. When using a quad-tuner having four channels, there are eight ADCs: four high frequency ADCs and four low frequency ADCs. Typically, there is one ADC associated with each channel. Thus, a quad-tuner would be used with an ADC module having four ADCs. However, by splitting and filtering each channel and increasing the number of ADCs in the ADC module, the system, assembly, and method in the present disclosure is able to increase the frequency bandwidth throughput along legacy radio frequency (RF) cables on a platform without the need of replacing any legacy hardware or the legacy RF cables.

15 Claims, 5 Drawing Sheets

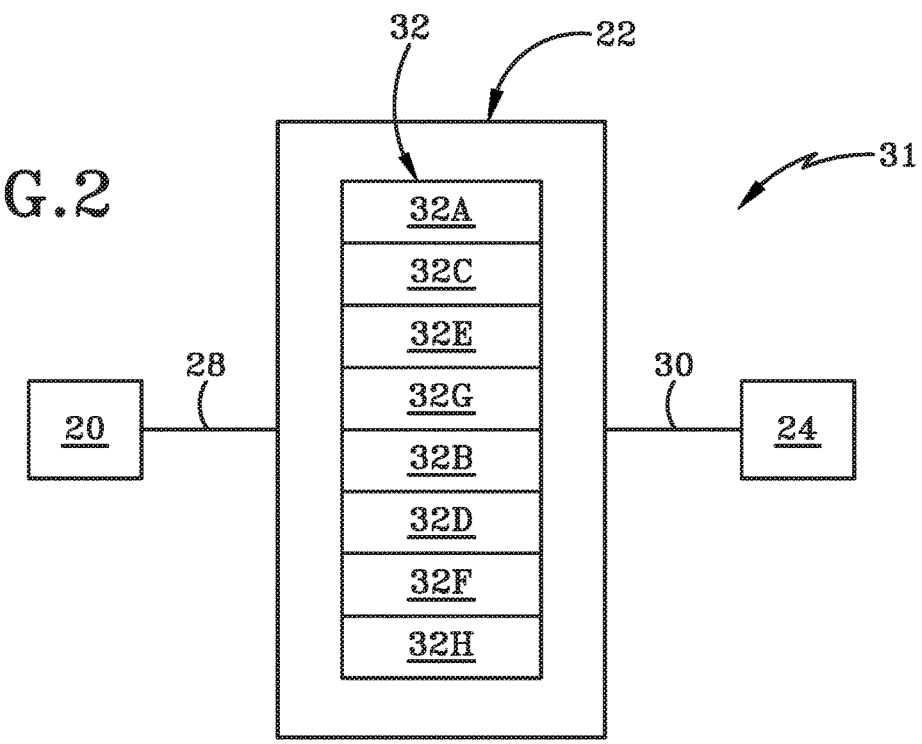
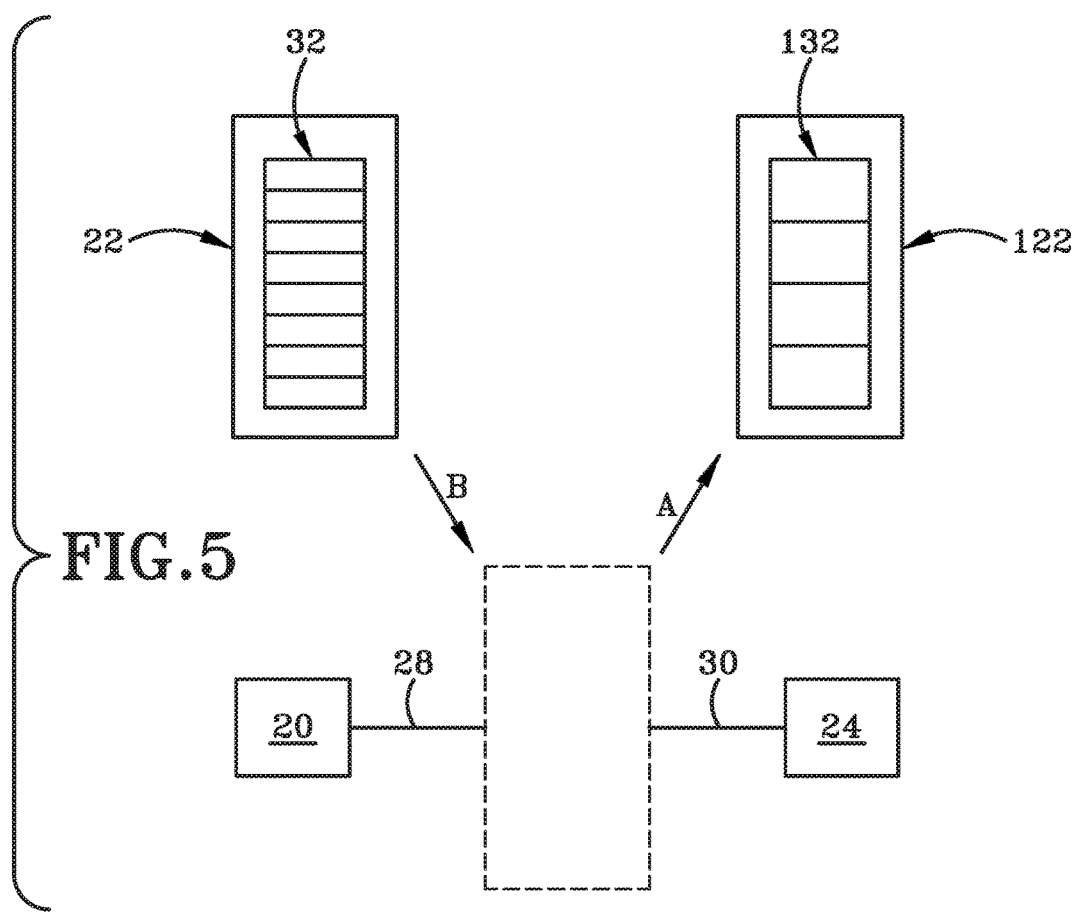

US 10,644,715 B1

ANALOG TO DIGITAL CONVERTER MODULE AND METHOD THEREOF

TECHNICAL FIELD

The present disclosure relates to signal processing and devices to perform the same. More particularly, the present disclosure relates to analog-to-digital converters that are configured in a manner to increase signal frequency space along legacy transmission mediums, such as a cable.

BACKGROUND

Background Information

Analog to Digital Converters (ADCs) sample at least one analog signal on each falling or rising edge of a sample clock. In each cycle, the ADC determines the analog signal, measures and converts it into a digital value. The ADC generally converts the output data into a series of digital values by approximating the signal with fixed precision.

ADCs require a mechanism that utilizes a sample clock that samples radio frequency (RF) data. When sampling an RF signal, the system typically cannot tell the difference between a signal in the first Nyquist region, the second Nyquist region, the third Nyquist region, and the other Nyquist regions. Each of the Nyquist regions has a duplicate spot (i.e., a harmonic or alias signal) that is output with the same digital code on the analog digital converter.

Typically, signal processing systems, logic, processes, or algorithms have filters that are placed around the Nyquist region that the system desires to operate. For example, when operating in the first Nyquist region, a low pass filter may be applied so as to block off any frequency regions above that of the first Nyquist region. Alternatively, if the system needs to operate in the second Nyquist region, a bandpass filter may be applied to second Nyquist frequency range such that any signals that are aliased in the first or third and above Nyquist regions are filtered out.

SUMMARY

On a platform, such as an aerial vehicle that may be manned or unmanned, ADCs are coupled with legacy cables that may be strung throughout the hull of the platform. Some of these cables are radio frequency (RF) cables. The RF cables are typically installed integral to the platform during its construction and are very difficult to replace once the platform has been fully constructed. More particularly, the RF cables are strung inside the hull of the platform and passed through various bulkheads and other support structures of the platform and therefore, removing or replacing the RF cables once the platform is fully deployed and installed with equipment cannot be done without significant effort. Thus, there is a desire to increase the bandwidth of the system and one of the ways this could be done would be to increase or improve the RF cables to allow them to carry more bandwidth. However, as explained above, replacing the RF cables is a significant endeavor. Thus, there exists a need to find an improved way to increase bandwidth of an electronic warfare (EW) system in order to detect enemy radar without replacing the legacy RF cables on the platform. Thus, an ADC performing a multi-Nyquist sampling approach in accordance with the present disclosure enables the EW system to put at least twice as much information on an existing RF cable than what was previously known. The assembly and system of the present disclosure enables the use of more frequency space over the RF cable.

Furthermore, issues continue to exist with currently available analog digital converters. Namely, EW systems typically desire to detect as many enemy radar systems as possible and the frequencies at which they operate are variable. Thus, the wider that the electronic warfare system can detect enemy radar, the more enemy radars may be detected at one time. Thus, increasing the bandwidth of the EW system increases the probability of detecting an enemy radar but it must be done in a manner that does not require replacing legacy RF cables or other cables on the platform.

In accordance with one aspect of the present disclosure, the assembly operates in a region where analog RF signal transitions to a digital representation of the signal. Thus, the multi-Nyquist approach of the present disclosure occurs at the transition from analog to digital representations of the signal.

In one aspect, an exemplary embodiment of the present disclosure may provide a system that utilizes a continuous RF space on an input cable to be sampled by multiple ADCs operating at different sample rates (i.e., frequency stacked) and selecting appropriate Nyquist zones such that the effective instantaneous bandwidth is the sum of the ADCs' bandwidths. This may allow for lower sample rates per ADC than would otherwise be needed to support the total bandwidth. The system may include at least one splitter to separate the continuous RF signal and then appropriate filtering on each leg of the split signal to allow the ADCs to operate at different input frequency ranges. The sample rates of the ADCs may be set to allow the top of one or more Nyquist zone(s) to slightly overlap the bottom of one or more Nyquist zone(s). This system and its associated method may reduce the required clock jitter and result in better performance. Further, this embodiment is not limited to two ADCs, as exemplary tests and models document the approach with three or more ADCs operation at different sample rates providing significant bandwidth coverage.

In another aspect, an exemplary embodiment of the present disclosure may provide method comprising: tuning a first signal to create a tuned first signal operating in a first frequency band; transmitting the tuned signal along a first cable associated with a first channel; splitting, with a first splitter coupled to the first cable, the tuned first signal into first portion and a second portion, wherein each portion of the tuned first signal includes the first frequency band; transmitting the first portion of the tuned first signal along a first segment of the first cable from the first splitter towards a first low frequency Analog to Digital Converter (ADC); filtering, with a first low pass filter coupled to the first segment of the first cable, the frequency band of the tuned first signal prior to the tuned first signal entering the first low frequency ADC; transmitting the second portion of the tuned first signal along a second segment of the first cable from the first splitter towards a first high frequency ADC; filtering, with a first high pass filter coupled to the second segment of the first cable, the first frequency band of the tuned first signal prior to the tuned first signal entering the first high frequency ADC; sampling, with a first clock coupled to the first low frequency ADC, the tuned first signal after filtering at a first sample rate; sampling, with a second clock coupled to the first high frequency ADC, the tuned first signal after filtering at a second sample rate, wherein the first sample rate is faster than the second sample rate; converting, in the first low frequency ADC, the tuned first signal from analog form into a digital form; converting, in the first high frequency ADC, the tuned first signal from analog form into a digital form; transmitting the tuned first signal in digital form, after sampling in the first low frequency ADC, to a first channel input in a first field programmable gate array (FPGA); and transmitting the tuned first signal in digital form, after sampling in the first high frequency ADC, to a first channel input in a second FPGA.

This exemplary embodiment or another exemplary embodiment may further provide tuning a second signal to create a tuned second signal operating in a second frequency band; transmitting the tuned second signal along a second cable associated with a second channel; splitting, with a second splitter coupled to the second cable, the tuned second signal into first portion and a second portion, wherein each portion of the tuned second signal includes the second frequency band; transmitting the first portion of the tuned second signal along a first segment of the second cable from the second splitter towards a second low frequency ADC; filtering, with a second low pass filter coupled to the first segment of the second cable, the second frequency band of the tuned second signal prior to the tuned second signal entering the second low frequency ADC; transmitting the second portion of the tuned second signal along a second segment of the second cable from the second splitter towards a second high frequency ADC; filtering, with a second high pass filter coupled to the second segment of the second cable, the second frequency band of the tuned second signal prior to the tuned second signal entering the second high frequency ADC; sampling, with the first clock coupled to the second low frequency ADC, the tuned second signal after filtering at the first sample rate; sampling, with the second clock coupled to the second high frequency ADC, the tuned second signal after filtering at the second sample rate; converting, in the second low frequency ADC, the tuned second signal from analog form into a digital form; converting, in the second high frequency ADC, the tuned second signal from analog form into a digital form; transmitting the tuned second signal in digital form, after sampling in the second low frequency ADC, to a second channel input in the first FPGA; and transmitting the tuned second signal in digital form, after sampling in the second high frequency ADC, to a second channel input in the second FPGA.

This exemplary embodiment or another exemplary embodiment may further provide tuning a third signal to create a tuned third signal operating in a third frequency band; transmitting the tuned third signal along a third cable associated with a third channel; splitting, with a third splitter coupled to the third cable, the tuned third signal into first portion and a second portion, wherein each portion of the tuned third signal includes the third frequency band; transmitting the first portion of the tuned third signal along a first segment of the third cable from the third splitter towards a third low frequency ADC; filtering, with a third low pass filter coupled to the first segment of the third cable, the third frequency band of the tuned third signal prior to the tuned third signal entering the third low frequency ADC; transmitting the second portion of the tuned third signal along a second segment of the third cable from the third splitter towards a third high frequency ADC; filtering, with a third high pass filter coupled to the second segment of the third cable, the third frequency band of the tuned third signal prior to the tuned third signal entering the third high frequency ADC; sampling, with the first clock coupled to the third low frequency ADC, the tuned third signal after filtering at the first sample rate; sampling, with the second clock coupled to the third high frequency ADC, the tuned third signal after filtering at the second sample rate; converting, in the third low frequency ADC, the tuned third signal from analog form into a digital form; converting, in the third high frequency ADC, the tuned third signal from analog form into a digital form; transmitting the tuned third signal in digital form, after sampling in the third low frequency ADC, to a third channel input in the first FPGA; and transmitting the tuned third signal in digital form, after sampling in the third high frequency ADC, to a third channel input in the second FPGA.

This exemplary embodiment or another exemplary embodiment may further provide tuning a fourth signal to create a tuned fourth signal operating in a fourth frequency band; transmitting the tuned fourth signal along a fourth cable associated with a fourth channel; splitting, with a fourth splitter coupled to the fourth cable, the tuned fourth signal into first portion and a second portion, wherein each portion of the tuned fourth signal includes the fourth frequency band; transmitting the first portion of the tuned fourth signal along a first segment of the fourth cable from the fourth splitter towards a fourth low frequency ADC; filtering, with a fourth low pass filter coupled to the first segment of the fourth cable, the fourth frequency band of the tuned fourth signal prior to the tuned fourth signal entering the fourth low frequency ADC; transmitting the second portion of the tuned fourth signal along a second segment of the fourth cable from the fourth splitter towards a fourth high frequency ADC; filtering, with a fourth high pass filter coupled to the second segment of the fourth cable, the fourth frequency band of the tuned fourth signal prior to the tuned fourth signal entering the fourth high frequency ADC; sampling, with the first clock coupled to the fourth low frequency ADC, the tuned fourth signal after filtering at the first sample rate; sampling, with the second clock coupled to the fourth high frequency ADC, the tuned fourth signal after filtering at the second sample rate; converting, in the fourth low frequency ADC, the tuned fourth signal from analog form into a digital form; converting, in the fourth high frequency ADC, the tuned fourth signal from analog form into a digital form; transmitting the tuned fourth signal in digital form, after sampling in the fourth low frequency ADC, to a fourth channel input in the first FPGA; and transmitting the tuned fourth signal in digital form, after sampling in the fourth high frequency ADC, to a fourth channel input in the second FPGA.

This exemplary embodiment may further provide removing a legacy ADC module from an assembly on a platform between a tuner and the first FPGA; replacing the legacy ADC module with an ADC module having the first through fourth low frequency ADCs and the first through fourth high frequency ADCs; reusing other legacy components on the platform coupled to the ADC module having the first through fourth low frequency ADCs and the first through fourth high frequency ADCs; and increasing bandwidth throughput along a radio frequency (RF) cable on the platform subsequent to replacing the legacy ADC module.

In yet another aspect, an exemplary embodiment of the present disclosure may provide platform having legacy radio frequency cables transmitting a first frequency capacity when used with a legacy first analog-to-digital converter (ADC) module that, when replaced with a new second ADC module transmits a second frequency capacity greater than the first frequency capacity along the legacy RF cables, the second ADC module comprising: a first channel; a first bandpass filter along the first channel; a first splitter downstream from the first bandpass filter that splits the first channel into a first segment and a second segment; a first low pass filter along the first segment of the first channel; a first low frequency ADC coupled to the first segment of the first channel; a first high pass filter along the second segment of the first channel; and a first high frequency ADC coupled to the second segment of the first channel. This exemplary embodiment or another exemplary embodiment may further provide wherein the second ADC module comprises: a second channel; a second bandpass filter along the second channel; a second splitter downstream from the second bandpass filter that splits the second channel into a first segment and a second segment; a second low pass filter along the first segment of the second channel; a second low frequency ADC coupled to the first segment of the second channel; a second high pass filter along the second segment of the second channel; and a second high frequency ADC coupled to the second segment of the second channel. This exemplary embodiment or another exemplary embodiment may further provide wherein the second ADC module comprises: a third channel; a third bandpass filter along the third channel; a third splitter downstream from the third bandpass filter that splits the third channel into a first segment and a second segment; a third low pass filter along the first segment of the third channel; a third low frequency ADC coupled to the first segment of the third channel; a third high pass filter along the second segment of the third channel; and a third high frequency ADC coupled to the second segment of the third channel. This exemplary embodiment or another exemplary embodiment may further provide wherein the second ADC module comprises: a fourth channel; a fourth bandpass filter along the fourth channel; a fourth splitter downstream from the fourth bandpass filter that splits the fourth channel into a first segment and a second segment; a fourth low pass filter along the first segment of the fourth channel; a fourth low frequency ADC coupled to the first segment of the fourth channel; a fourth high pass filter along the second segment of the fourth channel; and a fourth high frequency ADC coupled to the second segment of the fourth channel. This exemplary embodiment or another exemplary embodiment may further provide wherein the number of ADCs in the second ADC module at least doubles the number of ADCs that were present in the legacy first ADC module.

In yet another aspect, an exemplary embodiment of the present disclosure may provide disconnecting a legacy analog-to-digital (ADC) module a legacy radio frequency (RF) cable on a platform; disconnecting the legacy ADC module from a circuit downstream from the legacy ADC module; connecting a first ADC module to the legacy RF cable and the circuit, wherein the first ADC module includes a plurality of ADCs doubling that which were present in the legacy ADC module; and transmitting an analog signal along the legacy RF cable; splitting the analog signal, via a splitter in the first ADC module, into two segments, wherein each segment transmits the entire analog signal. This exemplary embodiment or another exemplary embodiment may further provide filtering, with a first filter, the analog signal in a first segment subsequent to splitting the analog signal; and filtering, with a different second filter, the analog signal in a second segment subsequent to splitting the analog signal.

In yet another aspect, an exemplary embodiment of the present disclosure provides an ADC module includes a plurality of frequency stacked ADCs. A splitter splits channels into two segments to transmit the signal through respective low pass and high pass filters to send the analog signal to a low frequency ADC and a high frequency ADC along each channel. When using a quad-tuner having four channels, there are eight ADCs: four high frequency ADCs and four low frequency ADCs. Typically, there is one ADC associated with each channel. Thus, a quad-tuner would be used with an ADC module having four ADCs. However, by splitting and filtering each channel and increasing the number of ADCs in the ADC module, the system, assembly, and method in the present disclosure is able to increase the frequency bandwidth throughput along legacy radio frequency (RF) cables on a platform without the need of replacing any legacy hardware or the legacy RF cables.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

FIG. 2 (FIG. 2) is a diagrammatic view of an assembly with the ADC module of the present disclosure coupled between a tuner and a downstream electrical device or circuit using existing cables or links on the platform.

FIG. 5 (FIG. 5) is a diagrammatic operational view of replacing a conventional ADC module with the ADC module of the present disclosure to increase the capabilities of legacy components within the system on the platform.

Similar numbers refer to similar parts throughout the drawings.

DETAILED DESCRIPTION

Figure 1:
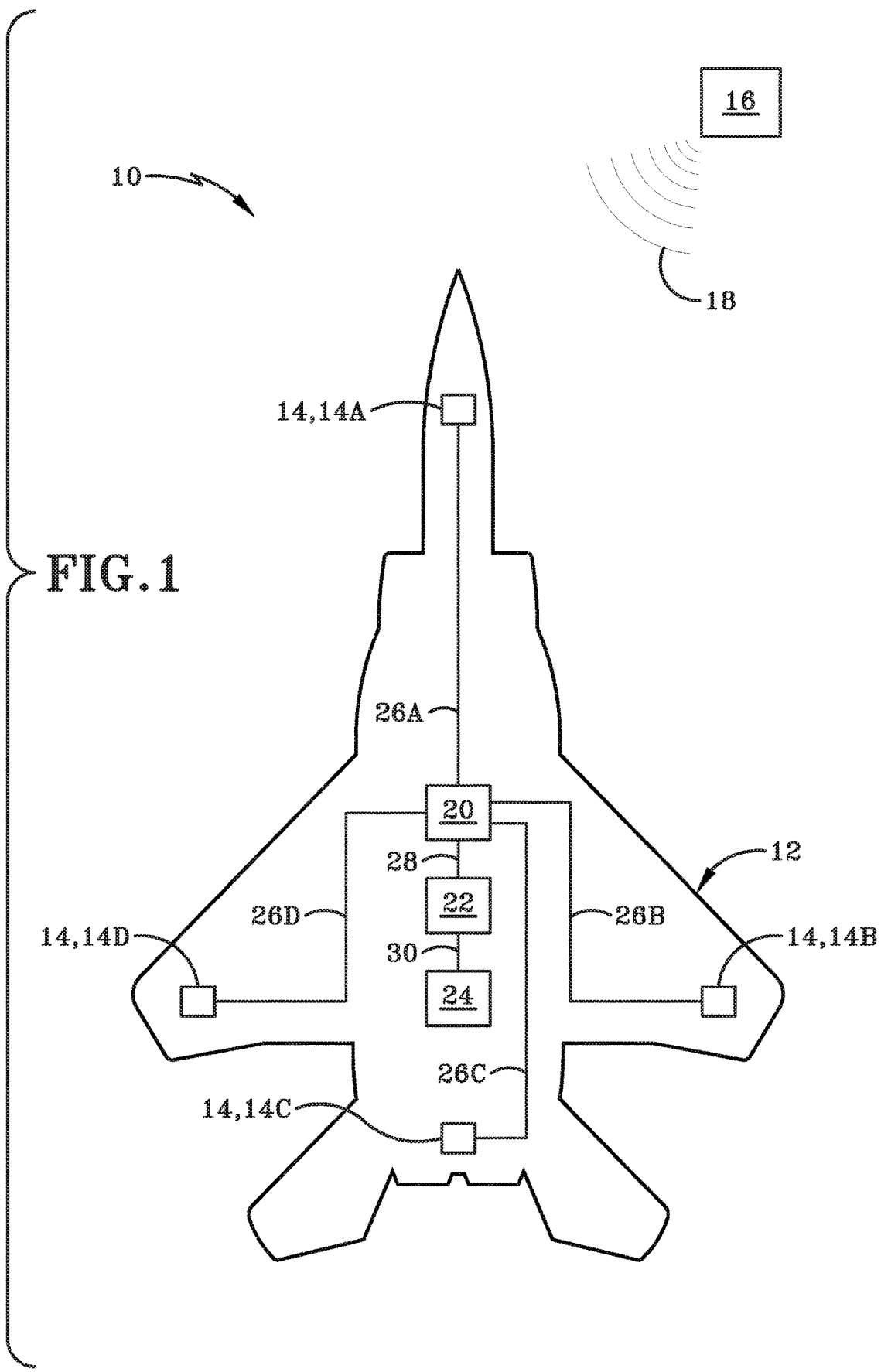
FIG. 1 (FIG. 1) is a schematic top view of a system in accordance with the present disclosure in which a platform includes a plurality of legacy components coupled with an ADC module of the present disclosure.

FIG. 1 depicts a system in accordance with one aspect of the present disclosure shown generally at 10. System 10 may include a platform 12 carrying a plurality of antennas 14 to detect a signal source 16 that generates a signal of interest 18. System 10 further includes a tuner 20, an analog-to-digital (ADC) module 22 carrying a plurality ADCs, and a downstream electrical device or circuit 24. As will be described in greater detail below, the system 10 is operative to use the plurality of ADCs in module 22 to increase radio frequency (RF) space of a legacy cable on platform 12.

Platform 12 may be any manned or unmanned vehicle and may be moveable relative to the ground surface 22. For example, platform 12 may be any aerial vehicle, such as an unmanned aerial vehicle (UAV), a drone, a helicopter or rotorcraft, a fixed wing aircraft, a satellite or the like. However, the platform 12 may also be a land-based vehicle, such as an armored truck, an armored vehicle, an unarmored vehicle, a tank or the like. Additionally, platform 12 may be a floating vessel, such as a ship or a submarine. As will be described in greater detail below, platform 12 carries electronics and other legacy hardware links, such as RF cables or other communication links, that are difficult to replace after construction of the platform.

Signal source 16 may be any device, electrical or otherwise, that generates a signal of interest 18. Signal source 16 is shown schematically in FIG. 1. However, it is to be understood that the signal source 16 may be a land-based signal generator or it may be an aerial-based or sea-based signal generator. Further, the signal source 16 may generate the signal of interest 18 purposefully or incidentally. For example, if the signal source 16 is a friendly communication device with the platform 12, then the signal of interest 18 may be a purposefully generated communication signal intended to be received by the platform 12. However, if the signal source 16 is a threat to the platform 12, then the signal of interest 18 may be incidentally generated in response to electrical actions performed by the signal source 16 that the platform 12 needs to be aware. Thus, aspects of the system 10 may be equally applied to commercial communication systems as well as electronic warfare (EW) systems or countermeasure systems for threats to the platform 12. For example, if an enemy to the platform 12 is operating a communication device near the platform 12 (either from the ground, in the air, or from the sea), then the communications of the enemy (signal source 16) with its combatants will incidentally generate the signal of interest 18 that desires to be received and known to the platform 12.

The plurality of antennas 14 may include a first antenna 14A, a second antenna 14B, a third antenna 14C, and a fourth antenna 14D. The plurality of antennas 14, as one having ordinary skill in the art understands, are used to accomplish direction finding techniques to locate the signal source 16 emitting the signal of interest 18. Typically, the plurality of antennas 14 are spaced apart from each other and mounted to different areas of the platform 12 in order to provide a sufficient distance between the respective antenna elements to accomplish the direction finding techniques to locate the signal source 16 generating the signal of interest 18. Accordingly, the first antenna 14A is depicted near the nose of the platform 12, the second antenna 14B is depicted on one wing of the platform 12, the third antenna 14C is depicted near the tail of the platform 12, and the fourth antenna 14D is depicted on another wing of the platform 12. However, as one having ordinary skill in the art understands, the platform 12 may be any type of platform and when implemented as other vehicles besides a fixed wing aircraft, the plurality of antennas 14 may be spaced apart and mounted to accomplish the direction finding techniques to locate the signal source 16. Further, the plurality of antennas will have known or determinable isolation values for their respective transmit and receive functions relative to other antennas in the plurality of antennas 14.

Legacy systems on the platform 12 are coupled to cooperate with the tuner 20, the ADC module 22, and the downstream electronic device or circuit 24 to filter out vibrations and other deflections of the platform 12 during its movement in a direction of travel. Further, it is to be understood that FIG. 1 depicts the detection of the signal of interest 18 initially with the first antenna 14A located near the nose of the platform 12. However, it is to be understood that any of the plurality of antennas 14 can establish the initial detection of the signal of interest 18. For example, if the signal source 16 were located aft of the vehicle or platform 12, then the third antenna 14C may be the first antenna to detect the signal of interest 18 emanating or transmitting from the signal source 16.

In some implementations, it is advantageous to place components or aspects, such as antenna arrays, from each respective antenna from the plurality of antennas 14 to conform with the outer skin or shell or hull of the platform 12. However, as is typical, the plurality of antennas 14 are legacy antennas or legacy components of the platform 12 and will be provided with the platform 12 during its construction. Accordingly, while the system 10 of the present disclosure may be fabricated as a new system during construction, it is contemplated that certain components, such as the plurality of antennas 14, will be legacy components on the platform 12 and other aspects of the present disclosure, which are described in greater detail below, will retrofit these legacy components to accomplish improved detection techniques by replacing certain modules or uploading new instructions that are executed by existing or legacy processors on the platform 12, which collectively increase a detection bandwidth for the signal of interest 18, without significantly increasing size, weight, power, and cost for the platform 12.

Each antenna from the plurality of antennas 14 may be coupled with the tuner 20. In one particular example, a first link 26A couples the first antenna 14A to the tuner 20. A second link 26B may couple the second antenna 14B to the tuner 20. A third link 26C may couple the third antenna 14C to the tuner 20. A fourth link 26D may couple the fourth antenna 14D to the tuner 20. Any of the links 26A-26D can be either wireless or wired communication channels. Stated otherwise, each of the links 26A-26D enables the transmission of an analog signal from each respective antenna 14 to the tuner 20, regardless of whether the respective link 26 is wired or wireless. Accordingly, the tuner 20 may be considered electrically downstream from the plurality of antennas 14. A communication link 28 couples the tuner 20 to the ADC module 22. In one particular embodiment, the communication link 28 is an electrical cable. More particularly, and in accordance with one particular aspect of the present disclosure, the communication link 28 is an RF cable that couples the tuner 20 to the ADC module 22. Even further, the communication link 28 may be a legacy RF cable that was installed on the platform, such as during its construction and can be considered integral to the platform such that its removal and replacement would be unduly costly and burdensome. Analog signals are sent along the RF cable 28 from the tuner 20 to the ADC module 22. Another communication link 30 couples the ADC module 22 to the downstream electrical device or circuit 24. The tuner 20, the ADC module 22, and the downstream electrical device 24 are oriented in a manner such that the tuner 20 is upstream from the ADC module 22 and couples via RF cable 28, and the ADC module 22 is upstream from the downstream electrical device or circuit 24 and coupled via another RF cable 30. Stated otherwise, the ADC module 22 is electrically intermediate the tuner 20 and the downstream circuit 24 and is respectively coupled to these devices by RF cable 28 and RF cable 30.

FIG. 2 depicts an assembly 31 within system 10 that is composed of the tuner 20, the ADC module 22, and the downstream electrical device or circuit 24. Within the assembly 31, the ADC module 22 includes a plurality of ADCs 32. In one particular embodiment, the plurality of ADCs 32 includes eight ADCs. More particularly, there may be a first high frequency ADC 32A, a first low frequency ADC 32B, a second high frequency ADC 32C, a second low frequency ADC 32D, a third high frequency ADC 32E, a third low frequency ADC 32F, a fourth high frequency ADC 32G, and a fourth low frequency ADC 32H. The ADC module 22 including the plurality of ADCs 32, namely, six or eight ADCs, is an improvement over existing ADC modules that typically only have four or fewer ADCs. Further, the conventional ADCs within a module are not split into high frequency regions and low frequency regions of the band of interest. Thus, with respect to the ADC module 22 of the present disclosure, the terms "high frequency" and "low frequency" refer to portioning or partitioning the band of interest into an upper region (i.e., high frequency) and a lower region (i.e., low frequency). The band of interest does not need to be partitioned or divided directly in half to divide the band of interest into the high frequency region associated with the high frequency ADCs 32A, 32C, 32E, and 32G and the low frequency region associated with the low frequency ADCs 32B, 32D, 32F, and 32H. However, in one particular example, it may be mathematically easier to divide the frequency band of interest in half between the high frequency portion and the low frequency portion. By way of one non-limiting example, if the frequency band of interest is from one gigahertz (1 GHz) to two gigahertz (2 GHz), then the term high frequency in this example would be the region of the frequency band of interest from 1.5 GHz to 2 GHz and the low frequency region of the band of interest would be from 1 GHz to 1.5 GHz.

Figure 3:
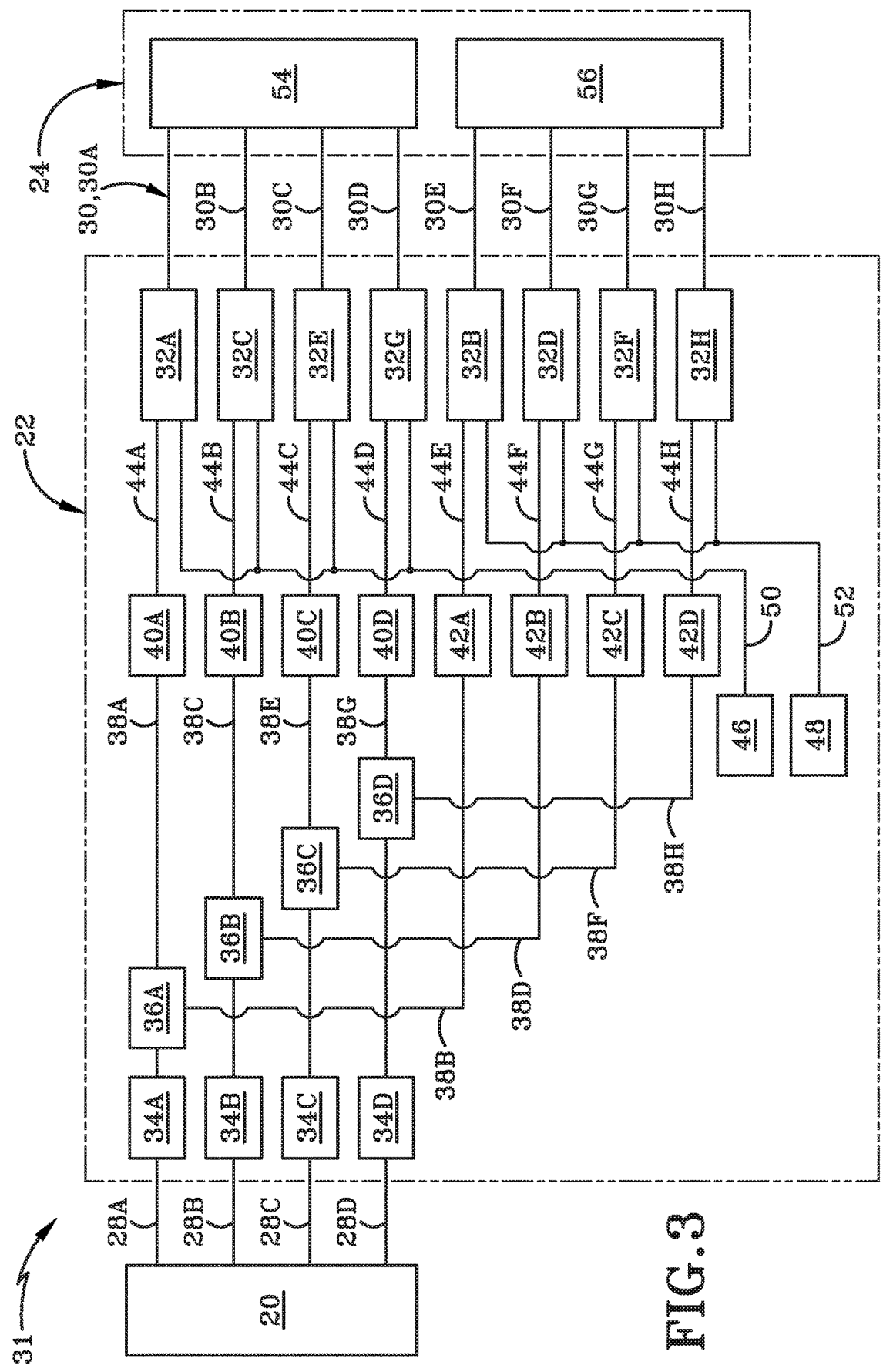
FIG. 3 (FIG. 3) is a schematic view of the assembly depicting components within the ADC module.

FIG. 3 depicts a schematic perspective of the assembly 31. Within assembly 31, the tuner 20 may include four channel outputs. A first channel output travels along a first RF cable 28A. A second channel output transmits along second RF cable 28B. A third channel output transmits along RF cable 28C. A fourth channel output transmits along fourth RF cable 28D. Along each RF cable 28A-28D, a filter such as an anti-alias filter or bandpass filter may filter the analog signal transmitted along each respective cable. In one example, a first bandpass filter 34A is coupled to the first RF cable 28A. A second bandpass filter 34B is coupled to the second RF cable 28B. A third bandpass filter 34C is coupled to the third RF cable 28C. A fourth bandpass filter 34D is coupled to the fourth RF cable 28D. A first splitter 36A is coupled to first RF cable 28A downstream from the first bandpass filter 34A. First splitter 36A splits the first RF cable 28A into a first segment 38A and a second segment 38B. A second splitter 36B is coupled to the second RF cable 28B downstream from the second bandpass filter 34B. The second splitter 36B splits the second RF cable 28B into a first segment 38C and a second segment 38D. A third splitter 36C is coupled to the third RF cable 28C downstream from the third bandpass filter 34C. The third splitter 36C splits the third RF cable 28C into a first segment 38E and a second segment 38F. A fourth splitter 36D is coupled to the fourth RF cable 28D downstream from the fourth bandpass filter 34D. The fourth splitter 36D splits the fourth RF cable 28D into a first segment 38G and a second segment 38H.

The first segment 38A from the first splitter 36A is coupled with a first low pass filter 40A. The second segment 38B from the first splitter 36A is coupled with a first high pass filter 42A. The first segment 38C from the second splitter 36B is coupled to a second low pass filter 40B. The second segment 38D from the second splitter 36B is coupled to a second high pass filter 42B. The first segment 38E from the third splitter 36C is coupled to a third low pass filter 40C. The second segment 38F from the third splitter 36C is coupled with a third high pass filter 42C. The first segment 38G from the fourth splitter 36D is coupled with a fourth low pass filter 40D. The second segment 38H from the fourth splitter 36D is coupled with a fourth high pass filter 42D.

The first low pass filter 40A is coupled with the first low frequency ADC 32A via link 44A. The second low pass filter 40B is coupled with the second low frequency ADC via link 44B. The third low pass filter 40C is coupled with the third low frequency ADC 32E via link 44C. The fourth low pass filter 40D is coupled with the fourth low frequency ADC 32G via link 44D.

The first high pass filter 42A is coupled with the first high frequency ADC via link 44E. The second high pass filter 42B is coupled with the second high frequency ADC via link 44F. The third high pass filter 42C is coupled with the third high frequency ADC via link 44G. The fourth high pass filter 42D is coupled with the fourth high frequency ADC 32H via link 44H.

ADC module 22 further includes a first clock 46 and a second clock 48. A link 50 couples the first clock 46 to the low frequency ADCs 32A, 32C, 32E, and 32G. A link 52 couples the second clock 48 to the high frequency ADCs 32B, 32D, 32F, and 32H. The first clock 46 has a faster sampling rate than the slower second clock 48. As indicated previously, the ADC module 22 is coupled with the downstream electrical device or circuit 24 via link 30. More particularly, a first link 30A couples the first low frequency ADC 32A to the circuit 24. More particularly, link 30A couples with a first channel of a four-channel low frequency field programmable gate array (FPGA) 54. A second link 30B couples the second low frequency ADC 32C to a second channel of the low frequency FPGA 54. Link 30C couples the third low frequency ADC 32E to a third channel of the low frequency FPGA 54. Link 30D couples the fourth low frequency ADC 32G to a fourth channel of the low frequency FPGA 54.

Link 30E couples the first high frequency ADC 32B to a four-channel high frequency FPGA 56. Link 30F couples the second high frequency ADC 32D to a second channel of the high frequency FPGA 56. Link 30G couples the third high frequency ADC 32F to a third channel of the high frequency FPGA 56. Link 30H couples the fourth high frequency ADC 32H to a fourth channel of the high frequency FPGA 56. In one particular embodiment, the electrical circuit or downstream device 24 is a legacy device within assembly 31 composed of the four-channel low frequency FPGA 54 and the four-channel high frequency FPGA 56.

Figure 4:
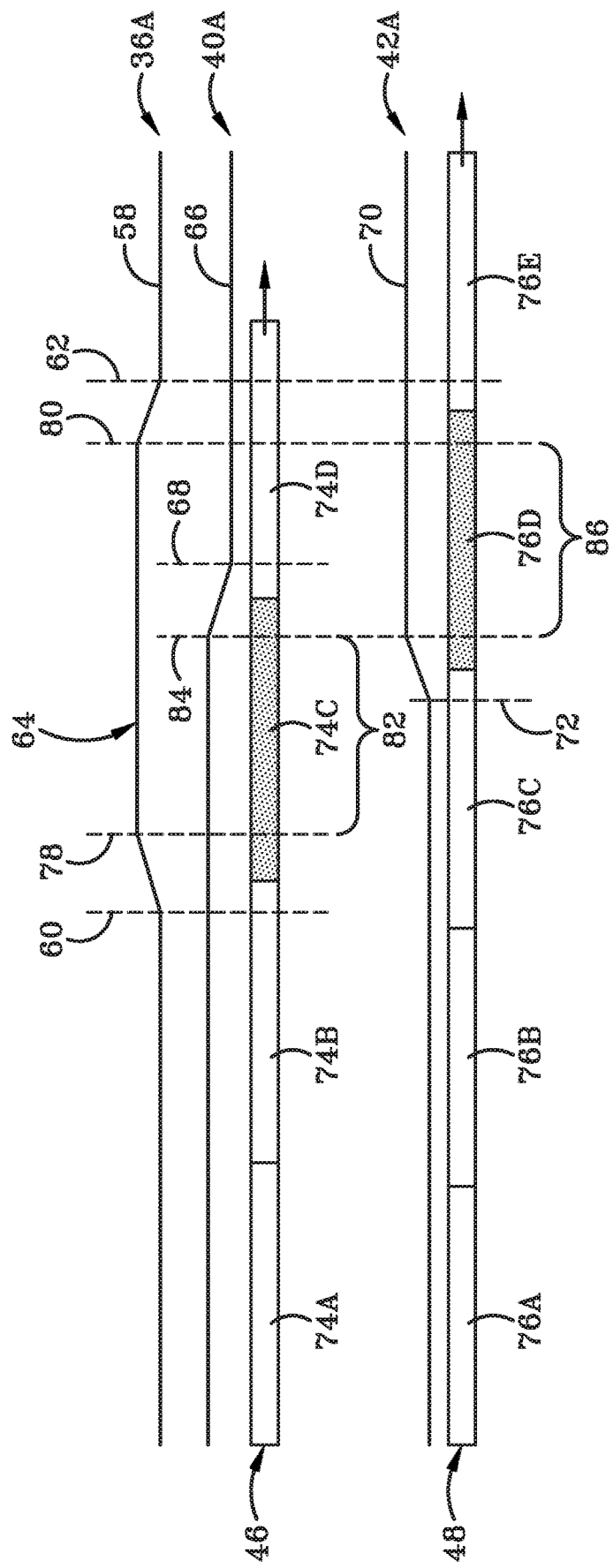
FIG. 4 (FIG. 4) is an exemplary graph depicting a frequency band within which a signal of interest resides that overlaps differing Nyquist regions generated by two different clocks in the ADC module.

FIG. 4 depicts an exemplary sampling region for the first channel of the ADC module 22. Line 58 represents frequencies in a band wherein the first bandpass filter 36A only permits frequencies to pass along cable 28A between the frequency minimum 60 and the frequency maximum 62. Thus, a pass band region 64 is defined between the filter minimum 60 and the filter maximum 62. Line 66 represents the frequency bands for the first low pass filter 40A wherein the first low pass filter 40A only permits signals having a frequency less than the filter maximum 68 to pass through. Line 70 represents the frequency band wherein the first high pass filter 42A only permits frequencies to pass the high pass filter 42A that are above a filter minimum 72. The faster first clock 46 has a first Nyquist region 74A, a second Nyquist region 74B, a third Nyquist region 74C, and a fourth Nyquist region 74D. The slower second clock 48 includes a first Nyquist region 76A, a second Nyquist region 76B, a third Nyquist region 76C, a fourth Nyquist 76D, and a fifth Nyquist region 76E. Because the first clock 46 has a faster sampling rate than the slower second clock 48, the Nyquist regions associated faster clock 46 are larger than those associated with the slower second clock 48. State otherwise, first Nyquist region 74A is greater than first Nyquist region 76A. The second Nyquist region 74B associated with the faster first clock 46 is greater than the second Nyquist region 76B associated with the slower second clock 48. This trend continues and because the Nyquist regions are greater in the faster first clock 46, the respective Nyquist regions began and terminate at different frequencies. Stated otherwise, the first Nyquist region 76A associated with the slower second clock 48 terminates at a lower frequency than the first Nyquist region 74A associated with the faster first clock 46. The manner in which the system overlaps the Nyquist regions for the first and second clocks 46, 48 for performing measurement calculations is described in greater detail below.

The frequency band of interest associated with the first channel extends between a low frequency 78 and a high frequency 80. The low frequency region 82 extends from low frequency 78 to mid-frequency 84. The high frequency region extends from the mid frequency 84 to the frequency high 80. The high frequency region 86 has a higher frequency than the low frequency region 82.

FIG. 5 depicts a schematic representation of constructing assembly 31 in accordance with one aspect of the present disclosure. As discussed previously, certain components of system 10 may be legacy components on platform 12. For example, the tuner 20 coupled with the plurality of antennas 14 can be an existing legacy tuner that is connected with a legacy cable 28 on the platform 12. It may be desirable to reuse these components, but find an improved way in accordance with the present disclosure to maximize their bandwidth measurements. Further, replacing these components may be costly due to their integration in the platform 12 during its construction. Accordingly, a conventional ADC module 122 having only four ADCs 132 may be removed from its connection with cable 28 as indicated by Arrow A. After removing the conventional ADC module 122, then the ADC module 22, in accordance with the present disclosure, may be inserted and coupled to cable 28 in its place as indicated by Arrow B. Furthermore, the ADC module 22 connects with line 30 extending to the downstream electrical device or circuit 24, which has been shown in previous embodiments to include two legacy FPGAs, namely, a low frequency FPGA 54 and a high frequency FPGA 56. Thus, the ADC module 22, in accordance with the present disclosure, increases the frequency bandwidth moving along cable 28 without the need to replace the same. Stated otherwise, ADC module 22 is coupled into assembly 31, as indicated by arrow B, into the region from which the old ADC module 122 was removed.

With continued reference to FIG. 5, the platform 12 has legacy radio frequency cables 28 transmitting with a first frequency capacity when used with a legacy first ADC module 122 that, when replaced with a new second ADC module (i.e., ADC module 22) transmits a second frequency capacity greater than the first frequency capacity along the legacy RF cables 28.

Having thus described some exemplary configurations of system 10 and assembly 31, reference will now be made to its operation and exemplary advantages.

In accordance with one aspect of the present disclosure, the system 10 and assembly 31 increase the number of analog to digital converters (ADCs) by removing the old legacy ADC module 122 from the platform 12 and installing a new and improved ADC module 22 carried by a chassis having similar connectors that define a replacement module that can be installed along the legacy RF cables 28 in the platform 12. In other aspects of the present disclosure, the assembly 31 may include a single module within the chassis such that the chassis itself does not need to be replaced and the module may include an increased number of ADCs as described in greater detail below. The new module having more ADCs than the previous module that are connected in the manner described below allows twice as much information to travel along the existing legacy RF cables on the platform.

In accordance with one aspect of the present disclosure, the tuner 20 has an output connected via a legacy RF cable(s) 28 with an input of the ADC module 22. The tuner 20 now puts twice as much information onto the RF cable than what was previously performed. The ADC module 22 can then receive the information sent along the existing legacy RF cable 28 to interpret the amount of information sent through the cable 28 by the tuner 20. An exemplary tuner 20 has the ability to double or quadruple or even multiply by eight times the amount of bandwidth that was previously possible by programming the tuner in an improved way.

The ADC module 22 in accordance with the present disclosure is coupled with a downstream destination or circuit 24 via a second legacy RF cable or link 30. In one particular embodiment, the downstream destination is at least one FPGA (such as FPGA 54 or FPGA 56). The FPGA can be on the same module or circuit card as the ADC module, however, in other embodiments it may located remotely from the ADC module. The FPGA takes the digitized data from the ADC module and creates a way to detect and measure the signals. The signals may further be sent downstream from the FPGA to additional software that generate a report for the software to analyze whether the received signal is a threat. The threat may be determined and analyzed to further be processed to provide the information to a countermeasure system or other aspects of the electronic warfare system.

More particularly, and with continued reference to FIG. 3, an exemplary method or process of assembly 31 on platform 12 in system 10 tunes, via tuner 20, a first signal along a first channel to create a tuned first signal operating in a first frequency band. The tuning performed by tuner 20 may selectively determine, through its programming, which channel the tuned analog first signal should propagate. This exemplary method then transmits the tuned analog signal along a first cable associated with a first channel. This transmission may occur or be effectuated by known transmission mechanism that electrically conduct the signal from one portion of the cable to a downstream portion of the cable. A bandpass filter (such as first filter 34A) filters the tuned analog first signal to generate an intermediate frequency (IF) of the tuned analog first signal. For example, the IF may be in a range from 1 GHz to 2 GHz, however other application specific intermediate frequency ranges are possible. This method then splits, with a first splitter (i.e., splitter 36A) coupled to the first cable, the tuned first signal into first portion and a second portion, wherein each portion of the tuned first signal includes the first frequency band. The assembly transmits the first portion of the tuned first signal along a first segment of the first cable from the first splitter towards the first low frequency ADC 32A. Then, a low pass filter (such as first low pass filter 40A) coupled to the first segment of the first cable filters the frequency band of the tuned first signal prior to the tuned first signal entering the first low frequency ADC. In one particular embodiment, simultaneous to transmitting the first portion of the tuned analog first signal along the first segment, the assembly transmits the second portion of the tuned first signal along a second segment of the first cable from the first splitter towards the first high frequency ADC 32B. A high pass filter coupled to the second segment of the first cable filters the first frequency band of the tuned first signal prior to the tuned first signal entering the first high frequency ADC.

The assembly samples, with the first clock 46 coupled to the first low frequency ADC, the tuned first signal after filtering at a first sample rate. The assembly samples with the second clock 48 coupled to the first high frequency ADC, the tuned first signal after filtering at a second sample rate, wherein the first sample rate is faster than the second sample rate. The assembly converts in the first low frequency ADC 32A, the tuned first signal from analog form into a digital form. In one particular embodiment, simultaneous to converting in the first low frequency ADC 32A, the assembly converts, in the first high frequency ADC 32B, the tuned first signal from analog form into a digital form. The assembly then transmits transmitting the tuned first signal in digital form, after sampling in the first low frequency ADC, to a first channel input in the first FPGA 54 and transmits the tuned first signal in digital form, after sampling in the first high frequency ADC, to a first channel input in the second FPGA 56. While some exemplary embodiments discussed herein may perform some actions simultaneously, it is possible that actions occur non-simultaneously or independently without departing from the scope of the present disclosure. A similar process may be repeated for each channel from the tuner 20.

In operation and according to an exemplary embodiment of the present disclosure, assembly 31 may typically operate in the second Nyquist region. In one exemplary non-limiting advantage, the second Nyquist region may be preferable because harmonics, which are essentially alias or spurious signals operating at a multiple of the frequency. When operating in the second Nyquist region, the harmonic signals are not located in the second Nyquist region, but rather they are in the first Nyquist region or the third and above Nyquist regions. Thus, the assembly 31 can include bandpass filter(s) (such as filters 34A-34D) for the second Nyquist region to guarantee that harmonics from the tuner are not what are causing the system to detect signals. In one implementation, it may be advantageous to use the second Nyquist region as the region of interest because every time that the operating region doubles in frequency, the system loses six decibels (dB) of signal-to-noise ratio. Stated otherwise, the detection distance is decreased by half every time the Nyquist region doubles. Thus, it may be beneficial to choose a Nyquist region that is as low as possible without having harmonics. However, the second Nyquist region may still be more efficient than the first Nyquist region because if a signal of interest has a frequency of 100 megahertz, then the harmonic signals would be at 200 megahertz, 300 megahertz, 400 megahertz, and so on which would all still be within the first Nyquist region.

In operation and with reference to FIG. 3, the system of the present disclosure includes a tuner at an upstream end. In one particular embodiment, the tuner 20 may be a quad 4X tuner. The tuner 20 includes four channels with each channel having its own dedicated RF cable 28 connected with an output of the tuner. In one particular embodiment there are four cables, each cable associated with one channel of the tuner. More particularly, the first cable 28A is associated with the first channel, the second cable 28B is associated with the second channel, the third cable 28C is associated with the third channel, and the fourth cable 28D is associated with the fourth channel. Thus, there may be four different cables, but system 10 and assembly 31 of the present disclosure is able to put twice as much information across each one of the respective cables. Further, the system 10 and assembly 31 may be expanded to any number of cables associated with the tuner. Thus, if there is an eight-channel tuner, there would be eight cables associated with the tuner wherein one cable would be associated with each of the eight channels. The tuner 20 is putting twice as much information on each respective cable than what was previously done with conventional tuners. With more information, such as a wider bandwidth traveling across each RF cable, the multi-Nyquist ADC assembly 31 of the present disclosure is able to detect the wider bandwidths and greater amount of information traveling across each RF cable to interpret a greater amount of signals occurring over a larger bandwidth.

Each respective RF cable output from the tuner should include the anti-alias filter ((AAF), which operates as a bandpass filter 34A-34D to bracket the entire bandwidth of interest output from the tuner. The AAF, which operates as a bandpass filter, filters out the harmonics such that they do not show up during a signal processing event. More particularly, when operating in the second Nyquist region, the AAF or bandpass filter 34A-34D for each respective channel will filter out all signals below the second Nyquist region and above the second Nyquist region. Stated otherwise, the AAF filters out any signals present in the first Nyquist region and filters out any signals present in the third Nyquist region or above. This structure is repeated for each respective channel. Thus, it is to be understood that there are an equal number of AAF or bandpass filters as there are RF cables. Thus, in the embodiment depicted in FIG. 3, there are four AAF or bandpass filters with one AAF or bandpass filter being associated with each RF cable.

In accordance with one aspect of the present disclosure, it is desirable that each RF cable has its own dedicated and independent AAF or bandpass filter because each channel has a different frequency and each AAF or bandpass filter needs to measure the signals independently from the other channels and if the system was utilizing a single AAF filter for all of the channels, the signals would mix together and would require a significant amount of further processing to accomplish the desired filter goals. However, this is not to say that a single AAF or bandpass filter would not be possible, it may just be less desirable than using four independent AAF or bandpass filters.

Along each RF cable, subsequent or downstream from the AAF or bandpass filters 34A-34D, there is a splitter that splits the RF cable into a first portion and a second portion. The splitter is distinguishable from a conventional ADC module inasmuch as conventional ADC modules do not include splitters to divide the RF cable into a first portion and a second portion. Rather, conventional ADC modules simply have an RF cable extending from the tuner to the ADC. The splitters split the signal for each respective channel such that the lower portion or half of the frequency range travels along the first portion of the RF cable and an upper portion or half of the frequency range travels along a second portion of the RF cable. The first portion associated with the low half of the frequency ranges extends to a first low frequency ADC and the upper half of the frequency associated with the second portion of the RF cable extends to a first upper ADC. Thus, the intermediate frequency range traveling along the first RF cable is split into a first portion and a second portion. While the exemplary embodiment shown herein divides the frequency band into an upper half and a lower half via the splitter, the division of the signal frequency range does not need to be 50:50. Other splitting ratios are entirely possible. For example, it may be possible to split a frequency range in unequal proportions such that a greater proportion of the frequency band travels to the first upper ADC or alternatively, a greater portion of the frequency band is split to travel to the first lower ADC. The RF cable for each channel is associated with an intermediate frequency. With respect to the present disclosure, intermediate frequency refers to a frequency range intermediate a frequency minimum and a frequency maximum. More particularly, in one particular example, the term intermediate frequency refers to a frequency range associated with the second Nyquist region. Thus, the second Nyquist region is intermediate inasmuch as it is above the first Nyquist region and below the third Nyquist region. Stated otherwise, as is typical in electronic warfare (EW) systems, the antenna receives an extremely wide bandwidth on the order or in a range from 2 GHz to 18 GHz. Thus, the tuner takes a portion of the frequency range from 2 GHz to 18 GHz and shifts the information at those frequencies down to a usable range that can be digitally sampled.

In one example, the splitter may be a discrete electric device that routes, or splits, or divides a defined amount of the electromagnetic power in the transmission line to the two respective segments, per channel, thereby enabling the signal to be used in by the two ADCs in said channel. In one embodiment, the splitter may be a directional coupler. An exemplary directional coupler is a pair of coupled transmission lines. They can be realized in a number of technologies including coaxial and the planar technologies (stripline and microstrip). The power on the coupled line flows in the opposite direction to the power on the main line, which is sometimes called a backward couple. Alternatively, a branch-line coupler consists of two parallel transmission lines physically coupled together with two or more branch lines between them. The branch lines are spaced $\lambda/4$ apart and represent sections of a multi-section filter design in the same way as the multiple sections of a coupled line coupler except that here the coupling of each section is controlled with the impedance of the branch lines. The main and coupled line are $\sqrt{2}$ of the system impedance. The more sections there are in the coupler, the higher is the ratio of impedances of the branch lines.

Alternatively, the splitter may be a discrete element, such as an RF transformer. For lower frequencies (less than 600 MHz) a compact broadband implementation by means of RF transformers is possible. One transformer reduces the voltage of the signal the other reduces the current. Therefore, the impedance is matched. The same argument holds for every other direction of a signal through the coupler. The relative sign of the induced voltage and current determines the direction of the outgoing signal. For a 3 dB coupling, that is equal splitting of the signal between the transmitted port and the coupled port, $n=\sqrt{2}$ and the isolated port is terminated in twice the characteristic impedance, namely 100Ω for a 50Ω system. A 3 dB power divider based on this circuit has the two outputs in 180° phase to each other, compared to $\lambda/4$ coupled lines which have a 90° phase relationship.

In another example, the splitter may be a discrete element, such as, a hybrid transformer. In a hybrid transformer, power at a first port is split equally between second and third but in antiphase to each other. The hybrid transformer is therefore a 180° hybrid. The center-tap is usually terminated internally but it is possible to bring it out as fourth port; in which case the hybrid can be used as a sum and difference hybrid. However, the fourth port presents as a different impedance to the other ports and will require an additional transformer for impedance conversion if it is required to use this port at the same system impedance.

Further, the splitter could be embodied as a power divider, such as a Wilkinson power divider having two parallel uncoupled $\lambda/4$ transmission lines. The input is fed to both lines in parallel and the outputs are terminated with twice the system impedance bridged between them. The design can be realized in planar format but it has a more natural implementation in coax—in planar, the two lines have to be kept apart so that they do not couple but have to be brought together at their outputs so they can be terminated whereas in coax the lines can be run side-by-side relying on the coax outer conductors for screening. The Wilkinson power divider solves the matching problem of the simple T-junction, and it has low VSWR at all ports and high isolation between output ports. The input and output impedances at each port are designed to be equal to the characteristic impedance of the microwave system. This is achieved by making the line impedance $\sqrt{2}$ of the system impedance, for a 50Ω system the Wilkinson lines are approximately 70Ω.

The splitter(s) may be integrated into the framework of the wiring board of the circuit embodied as the ADC module 22. Stated otherwise, when the circuit is a printed circuit board (PCB), the circuit board is designed to couple the signal from one trace (an upstream portion of the RF cable) into two traces (i.e., the first portion of the RF cable and the second portion of the RF cable downstream from the splitter). Subsequent to the splitter, all of the information travels along the first portion of the RF cable downstream from the splitter and all of the signal information travels along the second portion of the RF cable downstream from the splitter. Then, since each portion of the RF cable downstream from the splitter includes the entire frequency range, the first portion of the RF cable associated with the lower portion of frequency range may include a low pass filter to filter out the higher portion of the frequency signal traveling along the first portion of the RF cable to the first upper ADC. Similarly, the high pass filter may be coupled with the second portion of the RF cable downstream from the splitter to allow the higher portion of the frequency range to pass through the high pass filter and filter out the lower portion of the frequency signal such that the high frequency signal is passed to the first high frequency ADC. Thus, there may be a first low pass filter coupled to the first portion of the RF cable downstream from the splitter and a first high pass filter coupled to the second portion of the RF cable downstream from the splitter. The first high pass filter may be in operative communication with the first upper ADC and the first low pass filter may be operatively coupled with the first lower ADC.

Each high frequency ADC and each low frequency ADC operates at different clock rates. Some aspects of the present disclosure have selected clock rates that allow Nyquist zones to align perfectly or closely. Other selected clock rates do not allow Nyquist zones to perfectly align and they must be overlapped in a manner that still allows for the conversion of the signal to its digital representation without being interrupted by alias, spurious, or harmonics signals. In one particular embodiment, the manner in which the clock rates are selected is accomplished by the application specific needs. In some implementations, the clock rates are selected based on the tuner frequency that the system intends to operate over. The selected clock rates allow for half the bandwidth in one ADC, such as the first upper ADC, and the other half of the bandwidth in another ADC, such as the first lower ADC. The clock rates and the Nyquist zones may be selected by an automated tool that is preprogrammed based upon application specific variables to determine which Nyquist zones would have the strongest signal to noise ratio. Software that generates the most efficient clock rate accounts for each half (the lower and the upper) of the bandwidth is going to operate independently and will have its own first, second, third, and fourth Nyquist zones and so on. The clock rate software, process or algorithm, determines the ability to use much of the overlapping Nyquist zones from the first clock and the second clock but still be able to have an RF filter remove the aliases or harmonic signals as discussed above. Stated otherwise, the software or algorithm determines that if a bandpass filter is put around each individual frequency region, it determines that the bandpass filter can reject aliases. Thus, the system is trading off as much bandwidth that can used and the ability to actually create a filter that can reject the aliases on two different channels. Then, the system is aligning the top of one channel with the bottom of another channel.

The present disclosure takes advantage of commercially available ADCs. Currently, some ADCs are not fast enough to perform a brute force second Nyquist approach in a small enough package that would fit on the PCB. Thus, this technique applies for processing greater frequency bands with existing ADCs that were not presently able to accomplish such processing feats.

Downstream from each ADC, an output RF cable or link extends to two FPGAs 54, 56. Currently, FPGAs have not yet commercialized four channels are 4× (four times) bandwidth in a cost-effective manner and without sacrificing significant area on the circuit board. Further, if a system does not put all four channels into one FPGA, then the amount of interconnect between the FPGAs is extremely high. Further, this high interconnection would draw a significant amount of power and generate a significant amount of point heat. Thus, the assembly of the present disclosure allows half of each bandwidth to be put into each FPGA independently so that the system does not require the interconnects between the FPGAs 54, 56. All the connections that are needed stay within one FPGA or the other. Thus, the assembly of the present disclosure saves power and lessens generated heat from an interconnect perspective between the FPGAs. Further, if there is strong signal in the environment, the strong signal will only saturate one set of four of the ADCs and the assembly will still be able to measure the other half of the bandwidth along that channel.

In operation and with reference to FIG. 4, the system of the present disclosure is attempting to measure from the line 78 to the line 80. Thus, the overlap region between the lines 78, 80 is divided by a middle line 84 which identifies a break point between the regions that are separated between the first FPGA and the second FPGA, namely the lower frequency region 82 and the higher frequency region 86.

In operation and with continued reference to FIG. 4, the third Nyquist region 74C of the faster clock 46, the bandpass filter 36A rejects alias signals below the line 60 and above line 62. In some cases, it is accomplished via the low pass filter and in other cases it is accomplished via the AAF or bandpass filter adjacent the tuner. The system has overlapped the third region 74C of the faster clock with a portion of the fourth region 76D of the slower clock 48. This enables the alias filtering. Overlapping the Nyquist ranges to find a common frequency range for sampling has enabled the input bandwidth on all the analog to digital converters to operate above the second Nyquist zone. Thus, each ADC, in accordance with the present disclosure, will operate at a higher frequency to accommodate various base stations generating signals at these higher frequency ranges. Previously, the clock rates were unable to keep up with the frequencies that these base stations desire to operate. Thus, the assembly of the present disclosure takes advantage of the alias filtering to enable operation at the same clock rates that are currently available, but operate at higher frequencies and filter out the alias or harmonic signals.

In operation and with reference to FIG. 3, and more particularly the first FPGA 54 and the second FPGA 56, each FPGA 54, 56 has four inputs associated with each channel. In one implementation, the reason that there are four channels is that it enables the EW system to perform direction finding via the four antennas 14A-14D. Each antenna may have its own field of view. When each antenna has its own field of view, only one of the antennas may see a signal. The other three antennas might not be able to see a signal high enough to trigger a measurement. However, for the system to direction find, the system needs all four channels to measure. Then, whichever antenna saw the signal, it will trigger the other sectors or other antennas to perform a measurement and receive the data from those respective sectors or antennas detailing either amplitude or phase, depending upon the application's specific needs, and this amount of data is a tremendous amount of data. For example, in a channelized receiver, when one antenna identifies a signal of interest, the active monitoring by the remaining antennas drives the amount of data to a significant volume, typically on the order of about 0.5 terabyte per second. Thus, by keeping all four channels within each respective FPGA, this significant amount of data processing is avoided because the data does not need to be passed through. The assembly of the present disclosure solves and meets the current needs with currently available 2×FPGA. As used herein, the term "2×" refers to twice the bandwidth of a legacy RF system. 4×FPGAs will also be able to process this amount of data proficiently.

The system of the present disclosure utilizes frequency stacking of the ADCs 32A-32H by dividing the intermediate frequency passed along each channel by the band filters 34A-34D. However, this could be done with more than two frequency ranges. For example, the frequency range of interest may be divided and stacked into three frequency ranges or more as different applications may require. This would allow the system to cover a greater amount of frequency space.

The system of the present disclosure further reduces clock jitter. In general, when a system doubles the operating frequency of an IF range or frequency range, in order to get the same signal to noise ratio, the system will lose six dB of signal to noise ratio. Thus, the ability to see a radar will decrease by half. This equates to half of the distance that the radar can "see," observe, or detect. Stated otherwise, when a radar detection distance is doubled, the signal is attenuated by six decibels. Thus, unless the system is able to reduce clock jitter and the system or assembly uses the same clock source and the detection distance doubles, then signal to noise ratio will decrease by six decibels every time the detection distance doubles. However, reducing clock jitter, in some exemplary embodiments, can avoid this six decibel loss when the detection distance of the radar is increased.

Notably, the assembly of the present disclosure does not relate to folding Nyquist zones to increase bandwidth. Distinctively, a folding approach would eliminate the AAF or bandpass filters and allow the alias or harmonic signals into the processing logic. In these applications, a second data converter is placed in parallel with a different sample rate, then all the alias frequencies change. Then the two parallel channels are compared to determine which signals are the same to identify the real signal of interest.

According to another aspect, as discussed previously herein, the ADC module or assembly may evaluate and utilize legacy systems in the implementation of the processes discussed herein. Specifically, EW system 10 assets may be legacy assets (i.e., such as legacy tuners and legacy FPGAs or other downstream destinations) which may be retrofitted with software or other instructions to accomplish the features of the present disclosure without significantly increasing size, weight, power, or cost to existing legacy EW systems. The methods and processes may be uploaded to existing legacy assets, or may be added thereto through the use of an additional memory module, including an additional non-transitory storage medium, or through the use of temporary memory devices, such as flash memory or the like. Accordingly, the ADC module may allow these existing legacy assets to be optimized and used without significant physical adjustments thereto other than replacing the old module.

Figure 6:
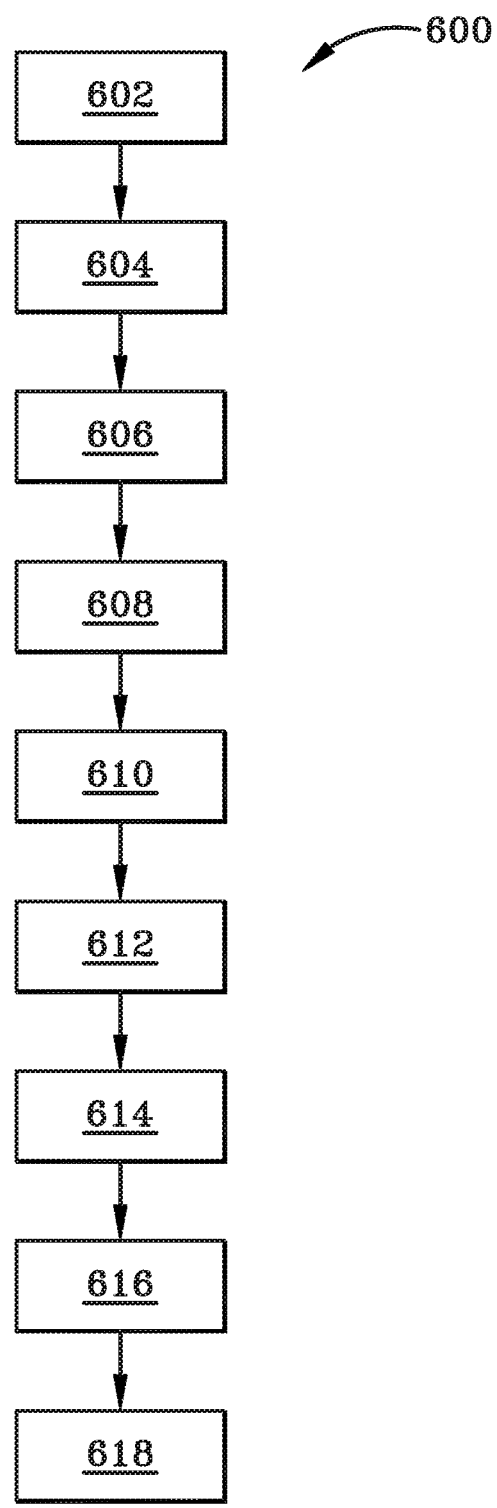
FIG. 6 (FIG. 6) is a flowchart in accordance with an exemplary method of the present disclosure.

FIG. 6 depicts an exemplary method in accordance with one aspect of the present disclosure generally at 600. Method 600 may include tuning a first signal to create a tuned first signal operating in a first frequency band, which is shown generally at 602. Method 600 may include transmitting the tuned first signal along a first cable associated with a first channel, which is shown generally at 604. Method 600 may include splitting the tuned first signal into first portion and a second portion, which is shown generally at 606. Method 600 may include transmitting the first portion of the tuned first signal along a first segment of the first cable towards a first low frequency ADC, which is shown generally at 608. Method 600 may include transmitting the second portion of the tuned first signal along a second segment of the first cable towards a first high frequency ADC, which is shown generally at 610. Method 600 may include sampling, with a first clock coupled to the first low frequency ADC, the tuned first signal at a first sample rate, which is shown generally at 612. Method 600 may include sampling, with a second clock coupled to the first high frequency ADC, the tuned first signal at a second sample rate, wherein the first sample rate is faster than the second sample rate, which is shown general at 614. Method 600 may include converting, in the first low frequency ADC, the tuned first signal from analog form into a digital form, which is shown generally at 616. Method 600 may include converting, in the first high frequency ADC, the tuned first signal from analog form into a digital form, which is shown generally at 618.

Method 600 may further include transmitting the tuned first signal in digital form to a first channel input in a first FPGA; and transmitting the tuned first signal in digital form to a first channel input in a second FPGA. Further, method 600 may include filtering, via a first bandpass filter, the tuned first signal prior to splitting the tuned first signal in the first splitter; filtering, via a first low pass filter, the first portion of the tuned first signal along the first segment of the first cable upstream from the first low frequency ADC; and filtering, via a first high pass filter, the second portion of the tuned first signal along the second segment of the first cable upstream from the first high frequency ADC. These steps or processes of method 600 may be repeated for the second channel, third channel, and fourth channel, respectively.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A method, comprising:
   tuning a first signal to create a tuned first signal operating in a first frequency band;
   transmitting the tuned first signal along a first cable associated with a first channel;
   splitting the tuned first signal into first portion and a second portion;
   transmitting the first portion of the tuned first signal along a first segment of the first cable towards a first low frequency Analog to Digital Converter (ADC);

transmitting the second portion of the tuned first signal along a second segment of the first cable towards a first high frequency ADC;
sampling, with a first clock coupled to the first low frequency ADC, the tuned first signal at a first sample rate;
sampling, with a second clock coupled to the first high frequency ADC, the tuned first signal at a second sample rate, wherein the first sample rate is faster than the second sample rate;
converting, in the first low frequency ADC, the tuned first signal from analog form into a digital form;
converting, in the first high frequency ADC, the tuned first signal from analog form into a digital form;
transmitting the tuned first signal in digital form to a first channel input in a first field programmable gate array (FPGA);
transmitting the tuned first signal in digital form to a first channel input in a second FPGA;
tuning a second signal to create a tuned second signal operating in a second frequency band;
transmitting the tuned second signal along a second cable associated with a second channel;
splitting the tuned second signal into first portion and a second portion, wherein each portion of the tuned second signal includes the second frequency band;
transmitting the first portion of the tuned second signal along a first segment of the second cable towards a second low frequency ADC;
transmitting the second portion of the tuned second signal along a second segment of the second cable towards a second high frequency ADC;
sampling, with the first clock coupled to the second low frequency ADC, the tuned second signal at the first sample rate;
sampling, with the second clock coupled to the second high frequency ADC, the tuned second signal at the second sample rate;
converting, in the second low frequency ADC, the tuned second signal from analog form into a digital form;
converting, in the second high frequency ADC, the tuned second signal from analog form into a digital form;
transmitting the tuned second signal in digital form, after sampling in the second low frequency ADC, to a second channel input in the first FPGA; and
transmitting the tuned second signal in digital form, after sampling in the second high frequency ADC, to a second channel input in the second FPGA.

2. The method of claim 1, further comprising:
filtering, via a first bandpass filter, the tuned first signal prior to splitting the tuned first signal in the first splitter;
filtering, via a first low pass filter, the first portion of the tuned first signal along the first segment of the first cable upstream from the first low frequency ADC; and
filtering, via a first high pass filter, the second portion of the tuned first signal along the second segment of the first cable upstream from the first high frequency ADC.

3. The method of claim 1, further comprising:
filtering, with a second bandpass filter, the tuned second signal prior to splitting the tuned second signal in the second splitter;
filtering, via a second low pass filter, the first portion of the tuned second signal along the first segment of the second cable upstream from the second low frequency ADC; and
filtering, via a second high pass filter, the second portion of the tuned second signal along the second segment of the second cable upstream from the second high frequency ADC.

4. The method of claim 1, further comprising:
tuning a third signal to create a tuned third signal operating in a third frequency band,
transmitting the tuned third signal along a third cable associated with a third channel;
splitting the tuned third signal into first portion and a second portion, wherein each portion of the tuned third signal includes the third frequency band;
transmitting the first portion of the tuned third signal along a first segment of the third cable towards a third low frequency ADC;
transmitting the second portion of the tuned third signal along a second segment of the third cable towards a third high frequency ADC;
sampling, with the first clock coupled to the third low frequency ADC, the tuned third signal at the first sample rate;
sampling, with the second clock coupled to the third high frequency ADC, the tuned third signal at the second sample rate;
converting, in the third low frequency ADC, the tuned third signal from analog form into a digital form;
converting, in the third high frequency ADC, the tuned third signal from analog form into a digital form;
transmitting the tuned third signal in digital form, after sampling in the third low frequency ADC, to a third channel input in the first FPGA; and
transmitting the tuned third signal in digital form, after sampling in the third high frequency ADC, to a third channel input in the second FPGA.

5. The method of claim 4, further comprising:
filtering, with a third bandpass filter, the tuned third signal prior to splitting the tuned third signal in the third splitter;
filtering, via a third low pass filter, the first portion of the tuned third signal along the first segment of the third cable upstream from the third low frequency ADC; and
filtering, via a third high pass filter, the second portion of the tuned third signal along the second segment of the third cable upstream from the third high frequency ADC.

6. The method of claim 4, further comprising:
tuning a fourth signal to create a tuned fourth signal operating in a fourth frequency band;
transmitting the tuned fourth signal along a fourth cable associated with a fourth channel;
splitting the tuned fourth signal into first portion and a second portion, wherein each portion of the tuned fourth signal includes the fourth frequency band;
transmitting the first portion of the tuned fourth signal along a first segment of the fourth cable towards a fourth low frequency ADC;
transmitting the second portion of the tuned fourth signal along a second segment of the fourth cable towards a fourth high frequency ADC;
sampling, with the first clock coupled to the fourth low frequency ADC, the tuned fourth signal after filtering at the first sample rate;
sampling, with the second clock coupled to the fourth high frequency ADC, the tuned fourth signal after filtering at the second sample rate;
converting, in the fourth low frequency ADC, the tuned fourth signal from analog form into a digital form;

converting, in the fourth high frequency ADC, the tuned fourth signal from analog form into a digital form;

transmitting the tuned fourth signal in digital form, after sampling in the fourth low frequency ADC, to a fourth channel input in the first FPGA; and transmitting the tuned fourth signal in digital form, after sampling in the fourth high frequency ADC, to a fourth channel input in the second FPGA.

7. The method of claim 6, further comprising:

filtering, with a fourth bandpass filter, the tuned fourth signal prior to splitting the tuned fourth signal in the fourth splitter;

filtering, with a fourth low pass filter, the first portion of the tuned fourth signal along the first segment of the fourth cable upstream from the fourth low frequency ADC; and filtering, with a fourth high pass filter, the second portion of the tuned fourth signal along the second segment of the fourth cable upstream from the fourth high frequency ADC.

8. The method of claim 6, further comprising:

wherein the ADC module is a replacement for a legacy ADC module on a platform between a tuner and the first FPGA;

reusing other legacy components on the platform coupled to the ADC module having the first through fourth low frequency ADCs and the first through fourth high frequency ADCs; and increasing bandwidth throughput along a radio frequency (RF) cable on the platform subsequent to replacing the legacy ADC module.

9. The method of claim 8, wherein a number of ADCs in the first ADC modules doubles a number of channels in the tuner.

10. A platform having legacy radio frequency cables transmitting a first frequency capacity when used with a legacy first analog-to-digital converter (ADC) module that, when replaced with a second ADC module transmits a second frequency capacity greater than the first frequency capacity along the legacy RF cables, the second ADC module comprising:

a first channel;

a first bandpass filter along the first channel;

a first splitter downstream from the first bandpass filter that splits the first channel into a first segment and a second segment;

a first low pass filter along the first segment of the first channel;

a first low frequency ADC coupled to the first segment of the first channel;

a first high pass filter along the second segment of the first channel; and a first high frequency ADC coupled to the second segment of the first channel;

wherein the second ADC module increases bandwidth throughput along the legacy RF cable on the platform subsequent to replacing the first ADC module.

11. The platform of claim 10, wherein the second ADC module comprises:

a second channel;

a second bandpass filter along the second channel;

a second splitter downstream from the second bandpass filter that splits the second channel into a first segment and a second segment;

a second low pass filter along the first segment of the second channel;

a second low frequency ADC coupled to the first segment of the second channel;

a second high pass filter along the second segment of the second channel; and a second high frequency ADC coupled to the second segment of the second channel.

12. The platform of claim 11, wherein the second ADC module comprises:

a third channel;

a third bandpass filter along the third channel;

a third splitter downstream from the third bandpass filter that splits the third channel into a first segment and a second segment;

a third low pass filter along the first segment of the third channel;

a third low frequency ADC coupled to the first segment of the third channel;

a third high pass filter along the second segment of the third channel; and a third high frequency ADC coupled to the second segment of the third channel.

13. The platform of claim 12, wherein the second ADC module comprises:

a fourth channel;

a fourth bandpass filter along the fourth channel;

a fourth splitter downstream from the fourth bandpass filter that splits the fourth channel into a first segment and a second segment;

a fourth low pass filter along the first segment of the fourth channel;

a fourth low frequency ADC coupled to the first segment of the fourth channel;

a fourth high pass filter along the second segment of the fourth channel; and a fourth high frequency ADC coupled to the second segment of the fourth channel.

14. The platform of claim 13, wherein the number of ADCs in the second ADC module at least doubles the number of ADCs that were present in the legacy first ADC module.

15. The platform of claim 13, wherein the number of ADCs in the second ADC module is double a number of channels output from a legacy tuner upstream from the second ADC module.

* * * * *